(12) United States Patent
Park

(10) Patent No.: US 8,637,912 B1
(45) Date of Patent: Jan. 28, 2014

(54) VERTICAL GATE DEVICE WITH REDUCED WORD LINE RESISTIVITY

(75) Inventor: Jinchul Park, Icheon (KR)

(73) Assignee: SK Hynix Inc., Icheon (KR)

( * ) Notice: Subject to any disclaimer, the term of this patent is extended or adjusted under 35 U.S.C. 154(b) by 0 days.

(21) Appl. No.: 13/544,902

(22) Filed: Jul. 9, 2012

(51) Int. Cl.
*H01L 27/108* (2006.01)

(52) U.S. Cl.
USPC .... 257/296; 257/306; 257/623; 257/E29.026; 257/E21.585; 438/239; 438/270; 438/330; 438/643

(58) Field of Classification Search
USPC .......... 257/296, 623, E29.026, E21.585, 257/E21.41, E27.011, E21.602, E29.255, 257/306, 330–336; 438/270, 239, 643, 330
See application file for complete search history.

(56) References Cited

U.S. PATENT DOCUMENTS

| | | | | |
|---|---|---|---|---|
| 6,537,870 | B1 * | 3/2003 | Shen | 438/243 |
| 8,207,032 | B2 * | 6/2012 | Fischer et al. | 438/242 |
| 8,395,139 | B1 * | 3/2013 | Ho et al. | 257/4 |
| 2008/0185571 | A1 * | 8/2008 | Happ et al. | 257/4 |
| 2009/0121268 | A1 * | 5/2009 | Lee et al. | 257/296 |
| 2009/0166723 | A1 * | 7/2009 | Sung et al. | 257/328 |
| 2009/0302380 | A1 * | 12/2009 | Graf et al. | 257/330 |
| 2010/0244124 | A1 * | 9/2010 | Seo et al. | 257/329 |
| 2011/0024816 | A1 * | 2/2011 | Moon et al. | 257/314 |
| 2011/0156134 | A1 * | 6/2011 | Kim | 257/329 |
| 2011/0233662 | A1 * | 9/2011 | Mikasa | 257/330 |
| 2011/0298013 | A1 * | 12/2011 | Hwang et al. | 257/208 |
| 2011/0304028 | A1 * | 12/2011 | Kim | 257/623 |
| 2012/0012913 | A1 * | 1/2012 | Lee | 257/302 |
| 2012/0018801 | A1 * | 1/2012 | Kobayashi et al. | 257/334 |
| 2012/0039104 | A1 * | 2/2012 | Lin et al. | 365/63 |
| 2012/0119278 | A1 * | 5/2012 | Mikasa | 257/306 |
| 2012/0135573 | A1 * | 5/2012 | Kim | 438/270 |
| 2012/0149193 | A1 * | 6/2012 | Fujiwara | 438/675 |
| 2012/0153365 | A1 * | 6/2012 | Sung | 257/288 |
| 2012/0156868 | A1 * | 6/2012 | Kim et al. | 438/589 |
| 2012/0181606 | A1 * | 7/2012 | Nagai | 257/334 |
| 2012/0267723 | A1 * | 10/2012 | Kim | 257/401 |
| 2012/0300557 | A1 * | 11/2012 | Kim | 365/189.05 |
| 2013/0029467 | A1 * | 1/2013 | Otsuka | 438/381 |
| 2013/0126954 | A1 * | 5/2013 | Wu et al. | 257/296 |

* cited by examiner

*Primary Examiner* — N Drew Richards
*Assistant Examiner* — Ankush Singal

(57) ABSTRACT

A semiconductor device includes a substrate having a primary side. A first pillar extends vertically with respect to the primary side of the substrate, the first pillar defining first and second conductive regions and a channel region that is provided between the first and second conductive regions. A first gate is provided over the channel region of the first pillar. A buried word line extends along a first direction below the first pillar, the buried word line configured to provide a first control signal to the first gate. A first interposer is coupled with the buried word line and the first gate to enable the first control signal to be applied to the first gate via the buried word line.

31 Claims, 9 Drawing Sheets

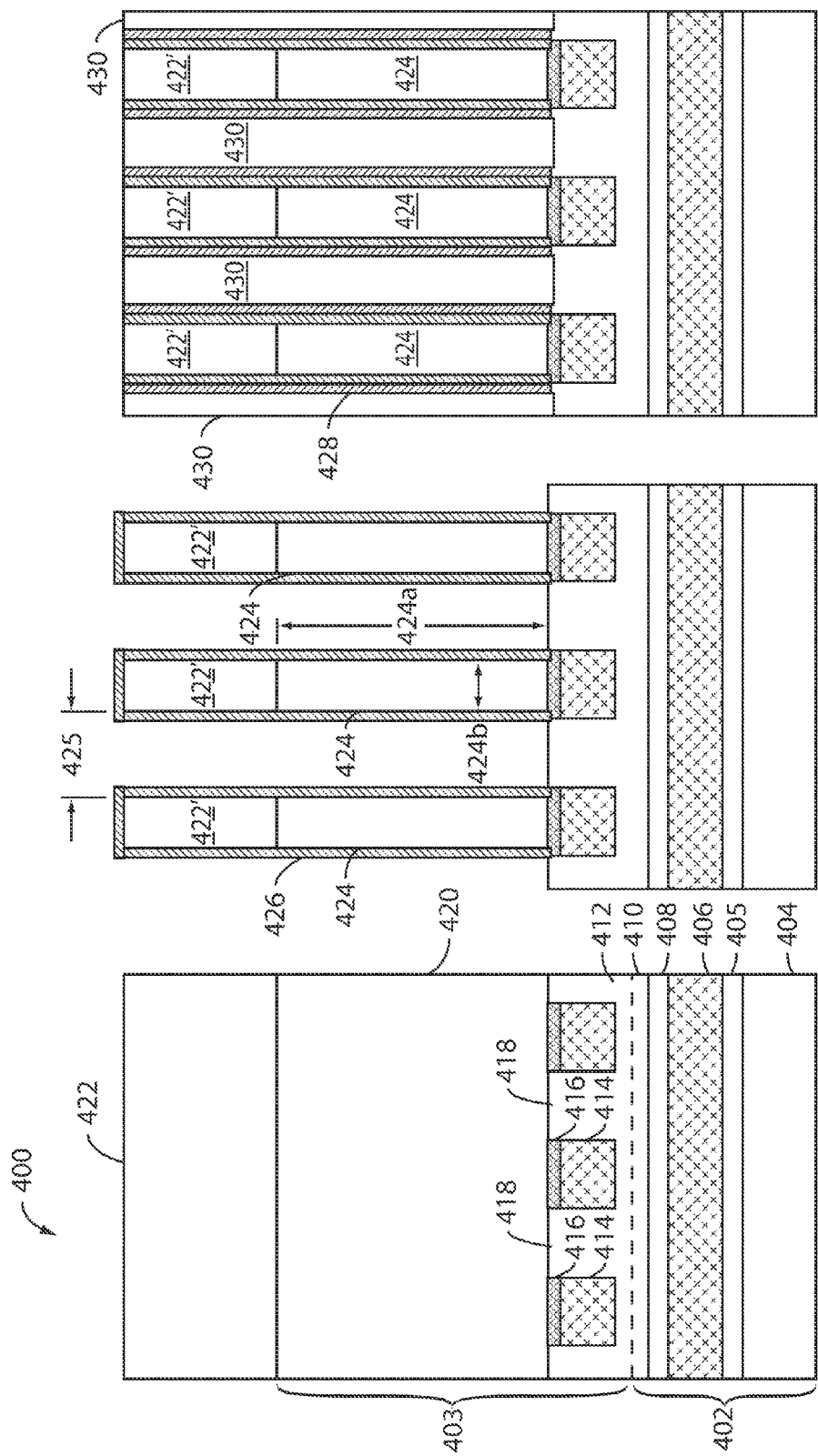

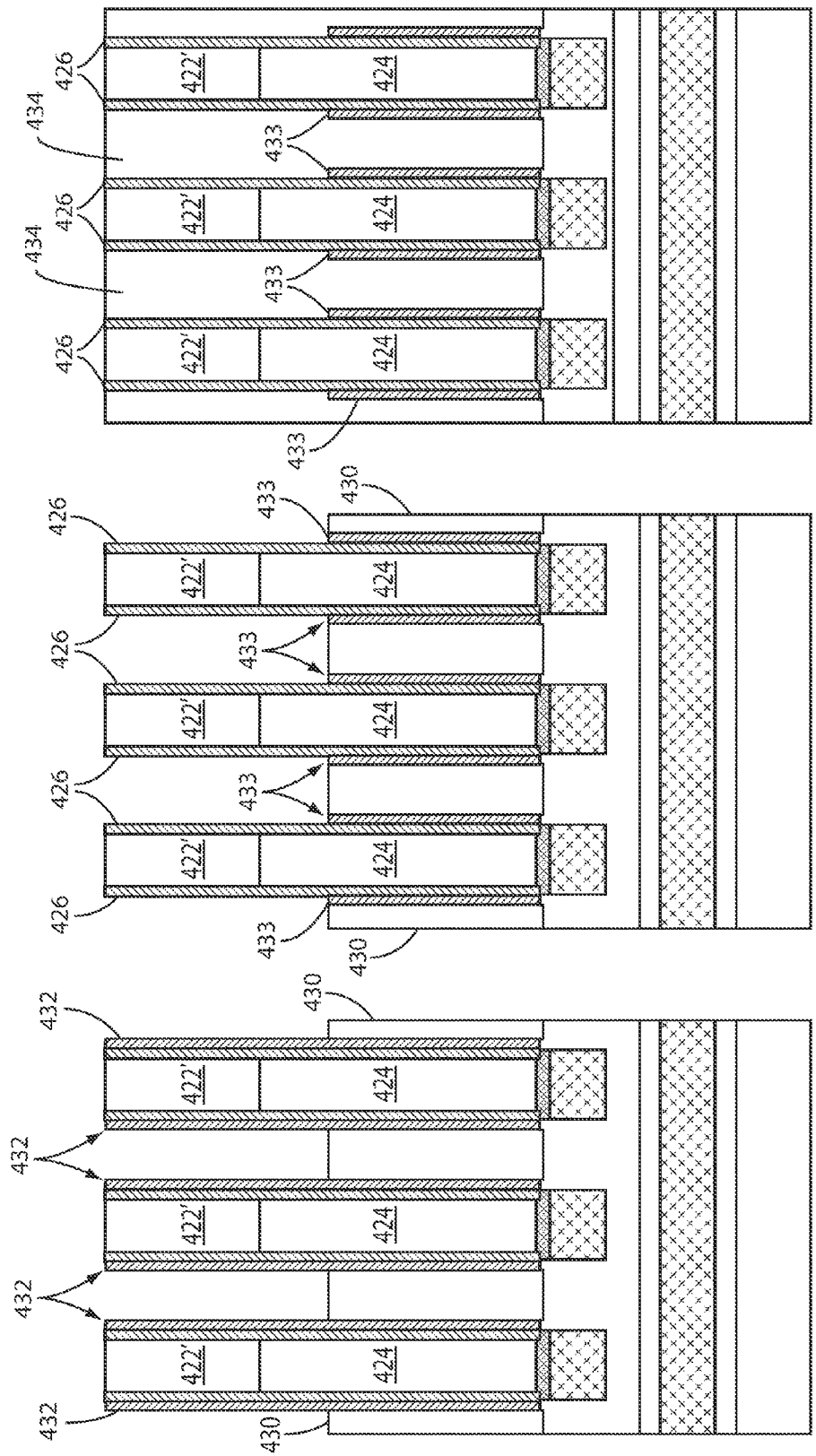

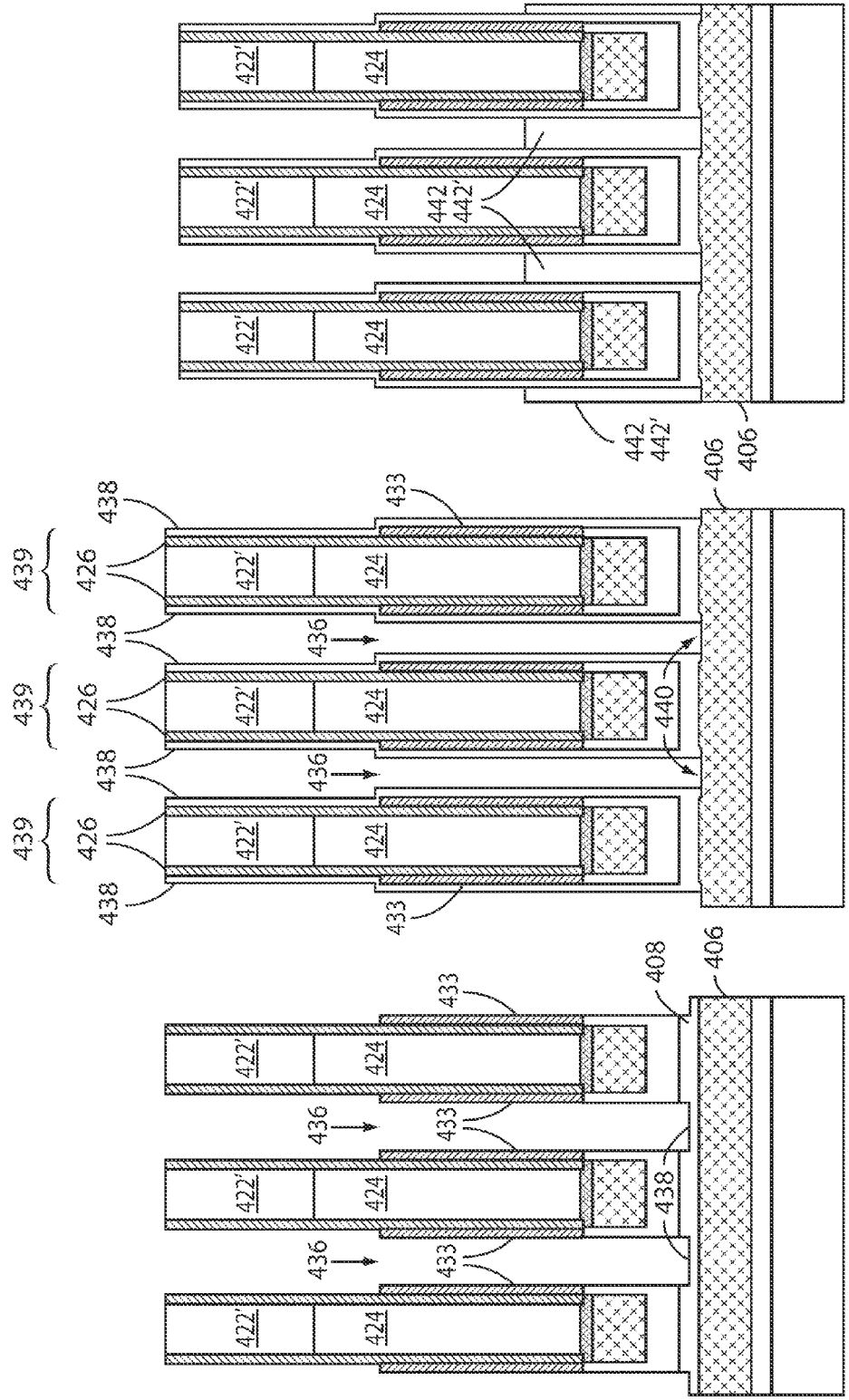

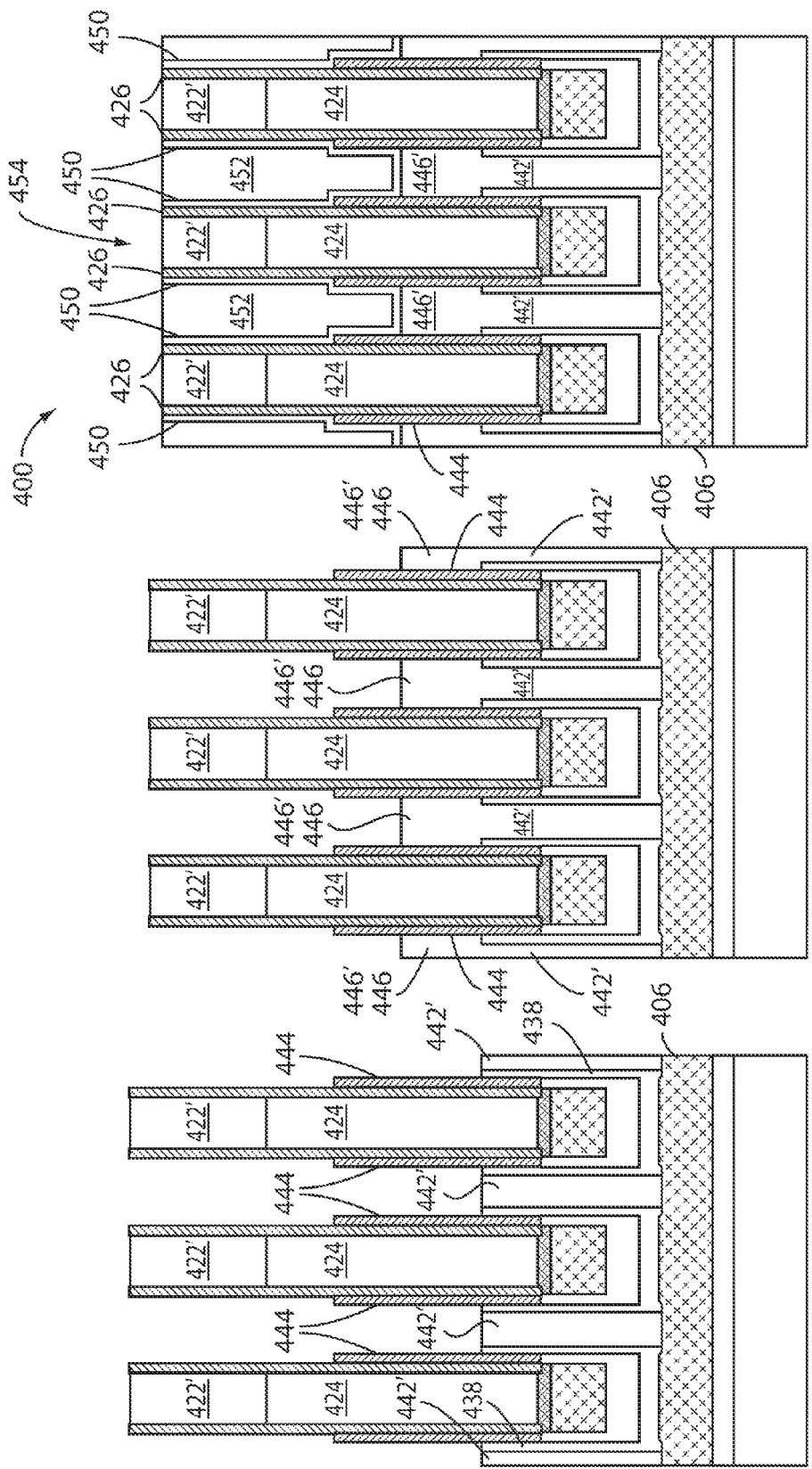

VERTICAL GATE DEVICE WITH REDUCED WORD LINE RESISTIVITY

CROSS-REFERENCES TO RELATED APPLICATIONS

Not Applicable

BACKGROUND OF THE INVENTION

The present invention relates to a semiconductor device having a vertical gate transistor and a method for forming the same.

For the past several decades, the semiconductor device has sustained astonishing advances and development. Every two years the size of the Metal-Oxide-Semiconductor (MOS) transistor has been reduced by a factor of two. The gate length (or gate size) has been one of the most important parameters for the semiconductor device scaling. Smaller gate lengths allow for higher packing density and faster circuits. This performance headroom also allows operation at lower voltages. This continued scaling of the transistor has made possible the explosive growth in information technology in the recent years.

At present, semiconductor devices having a physical gate length of 20 nm regime are being made. It is expected that the gate length will be reduced further and will approach 10 nm in the coming years. This scaling based simply on the reduced feature sizes, however, cannot continue forever.

DRAM industry, due to its need for high density chips, has taken a lead in the scaling of gate length. Since the size reduction in the planar direction is nearing its physical limitation, DRAM manufacturers are currently examining device scaling in the vertical direction. An example of vertical gate transistors being developed is vertical surrounding gate transistors (VSGT). VSGTs are typically metal-oxide-semiconductor field effect transistors (MOSFET) that have semiconductor pillars. The source, the drain, and the channel are defined in the pillar along a vertical direction. The gate wraps around the channel region of the pillar, and thus the name, "vertical surrounding gate transistor."

Among other benefits, vertical gate transistors make possible the use of much smaller memory cell designs of 4F2 (i.e., the cell is 2F×2F) compared to the current memory cell designs of 8F2 or 6F2. The term "F" refers to the minimum feature size for a given semiconductor device. The vertical transistor technology's compact cell design enables highly densely-packed semiconductor devices to be realized. However, introducing the vertical transistor technology into mass manufacturing may require resolving a number of issues. One of these issues is keeping the word line resistance relatively low even as the gates are made thinner in order to accommodate the cell size reduction.

BRIEF SUMMARY OF THE INVENTION

The present invention relates to a semiconductor device having a vertical channel transistor and a method for forming the same, more particularly, a semiconductor device having the word lines that are provided apart from the gates formed on the pillars. In embodiments of the present invention, the word lines are formed below the pillars defining the vertical transistors. The gate connectors (or interposers) are used to couple the corresponding gates and the word lines to each other. Accordingly, the thickness of the word lines does not need to be reduced as the pillars are brought closer to accommodate the cell size reduction. The word lines can be provided with sufficient thickness to keep the word line resistance at a manageable level since the word lines are separated from the gates. In an embodiment, word lines consisting essentially of metal are buried below the pillars. In an embodiment, the bit lines and the word lines are provided below the pillars.

In an embodiment, a semiconductor device includes a substrate having a primary side. A first pillar extends vertically with respect to the primary side of the substrate, the first pillar defining first and second conductive regions and a channel region that is provided between the first and second conductive regions. A first gate is provided over the channel region of the first pillar. A buried word line extends along a first direction below the first pillar, the buried word line configured to provide a first control signal to the first gate. A first interposer is coupled with the buried word line and the first gate to enable the first control signal to be applied to the first gate via the buried word line.

In an embodiment, a semiconductor device includes a plurality of first conductive lines extending along a first direction, each first conductive line being substantially parallel to each other. A plurality of second lines extends along a second direction and overlying the first conductive lines, each second conductive line being substantially parallel to each other. A plurality of pillars is provided, each pillar being provided over the first and second conductive lines, each pillar defining first and second conductive regions and a channel region that is provided between the first and second conductive regions. A plurality of gates is provided, each gate provided over the channel region of the each pillar. A plurality of interposers is provided, each interposer coupling one of the first conductive lines to one or more of the gates to enable a first control signal to be applied from said one first conductive line to said one or more gates.

In an embodiment, a semiconductor device includes a substrate having a primary side. A first pillar extends vertically with respect to the primary side of the substrate, the first pillar defining first and second conductive regions and a channel region that is provided between the first and second conductive regions of the first pillar. A first gate is provided over the channel region of the first pillar. A second pillar extends vertically with respect to the primary side of the substrate, the second pillar defining first and second conductive regions and a channel region that is provided between the first and second conductive regions of the second pillar. A second gate is provided over the channel region of the second pillar. A first buried word line extends along a first direction below the first and second pillars, the first buried word line being configured to provide a first control signal to the first gate. A first interposer is coupled with the first buried word line and the first gate to enable the first control signal to be applied to the first gate via the first buried word line. A second buried word line extends along substantially in parallel to the first buried word line below the first and second pillars, the second buried word line being configured to provide a second control signal to the second gate. A second interposer is coupled with the second buried word line and the second gate to enable the second control signal to be applied to the second gate via the second buried word line.

In an embodiment, a method for making a vertical gate transistor device includes providing a buried word line over a layer of material, the buried word line extending along a first direction; providing a buried bit line over the buried word line extending along a second direction different from the first direction, the buried word line and the buried bit line being separated from each other by at least one layer of insulation material; forming a pillar extending vertically above the buried bit lines and the buried word line, the pillar defining first and second conductive regions and a channel region that is provided between the first and second conductive regions; forming a gate dielectric layer over the pillar; forming a gate over gate dielectric at the channel region of the pillar; and forming an interposer coupling the buried word line and the gate to enable a first control signal to be applied to the gate via the buried word line.

BRIEF DESCRIPTION OF THE DRAWINGS

FIGS. 4A-4L illustrate a method for forming a semiconductor device having vertical gate transistors, buried bit lines and buried word lines according to embodiments of the present invention.

DETAILED DESCRIPTION OF THE INVENTION

The present invention relates to a semiconductor device having a vertical gate transistors and a method for forming the same, more particularly, a semiconductor device having the word lines and the gates formed apart from each other. Such semiconductor devices include memory devices and non-memory devices, and the invention is not limited to any particular semiconductor device type.

In embodiments of the present invention, the word lines are provided below the pillars defining the vertical transistors. Gate connectors (or interposers) are used to couple the word lines to the corresponding gates formed on the pillars. The thickness of the word lines does not need to be reduced as the pillars are brought closer and the cell size is reduced since the word lines and the gates are formed at separate locations. Accordingly, the word lines can be provided with sufficient thickness to keep the word line resistance at a manageable level even as the pillars are brought closer. In an embodiment, the bit lines (or buried bit lines) and the word lines (or buried word lines) are provided below the pillars. In an embodiment, the bit lines are formed on a first substrate and the word lines are formed on a second substrate. These substrates are bonded together to form the buried bit lines and the buried word lines on a resulting bonded substrate. Thereafter, pillars are formed by etching semiconductor material provided over the buried bit lines and the buried word lines.

Figure 1A:
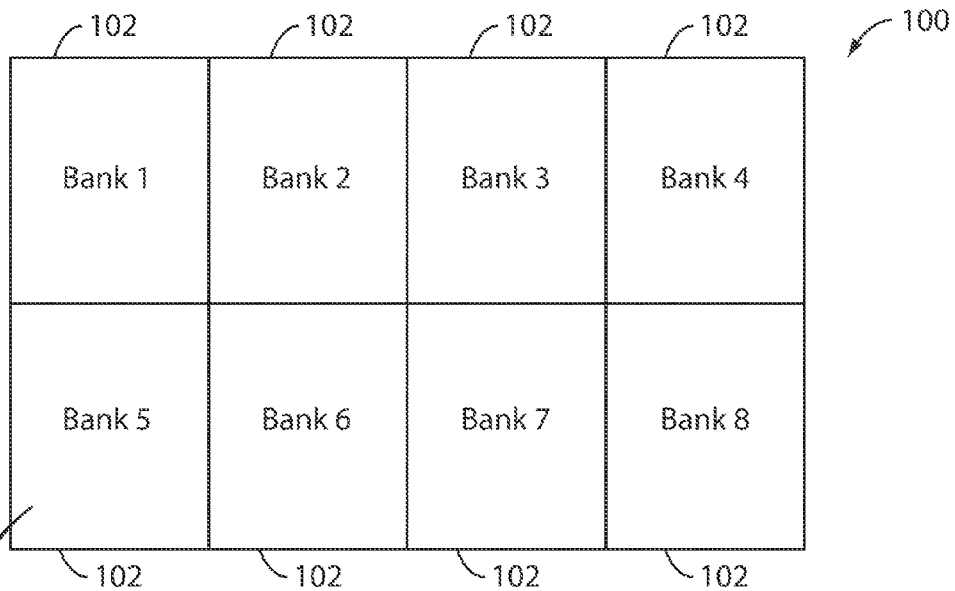
FIG. 1 illustrates a memory device, e.g., DRAM, having a plurality of banks.
Figure 1B:
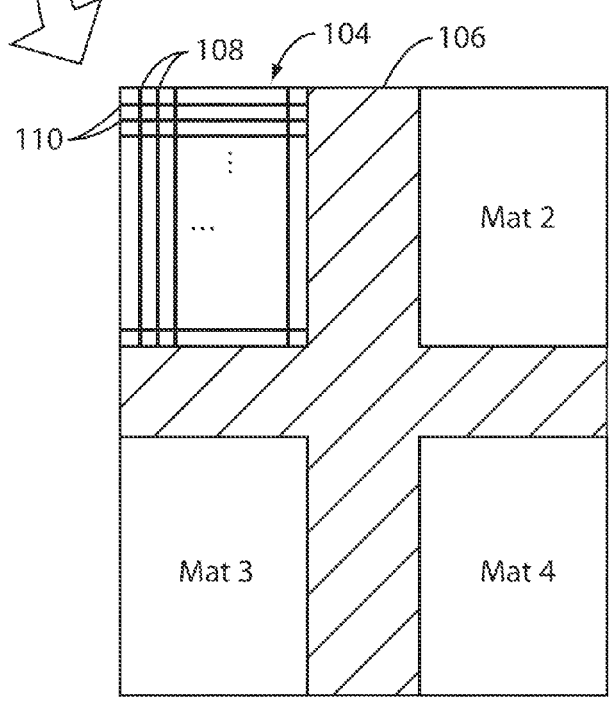

FIG. 1 illustrates a memory device 100, e.g., DRAM, having a plurality of banks 102. Each bank 102 includes one or more cell regions (or mats) 104 and one or more peripheral regions 106. Memory cells are formed in an array of columns 108 and rows 110 in the cell regions 104. Control circuits used to access the memory cells are provided in the peripheral regions 106. In an implementation, the memory device 100 includes eight banks 102, wherein each bank 102 has four cell regions 104 separated by a peripheral region(s) 106.

The columns 108 correspond to the bit lines, and the rows 110 correspond to the word lines. Bit lines are conductive line patterns that substantially extend from the top to the bottom of the cell region 104. Word lines are conductive line patterns that substantially extend laterally from one end to the other end of the cell region (e.g., from the left to the right of cell region). The intersection of a bit line and a word line define the address of a memory cell. Those skilled in the art would understand that the term "intersection" as used herein in connection with the bit line and the word line does not referred to physical contact between these two lines since that would make the device inoperable. Rather the term is used to indicate that the lines "intersect" (i.e., overlap) each other when seen from the top.

The memory cells in DRAM are charge storage cells consisting of one capacitor and one transistor per data bit. The transistor is turned on or off to store or discharge the charges from the capacitor according to information to be stored therein. The word lines apply control signals (or voltage signals) to the gates of the transistors in order to control the operation of the transistors. Typically the gates of the transistors in the same row in a cell region are formed as part of the same word line. Accordingly, the word lines are also referred to as "gate-contact lines" in conventional DRAM devices.

These word lines (or gate-contact lines) are also found in the vertical transistor devices currently being developed by certain companies. In these devices, the word line extends laterally and is formed on or around the pillars in the same row. Gate portions of the word line that are formed on or around the pillars define the gates of the transistors. Connecting portions of the word lines provided between the pillars connect the gates. As the distance between adjacent pillars is reduced to realize smaller device sizes, the thickness of the word lines would need to be reduced in order prevent a bridge from forming between neighboring gates. This would be a particular concern for the gate portions of the word line since they are formed on the pillars and are brought even closer to the adjacent gates as the pillars are brought closer. However, making the word lines thinner to avoid a bridge formation would result in increasing the word line resistance. Since the word lines typically extend substantially the entire lateral distance of a cell region, the increase in the word line resistance can have a significant impact on the drive current and the operational speed of the device. However, using higher voltages to offset the reduction in the operational speed would require more power and would create problems of its own.

Figure 2A:
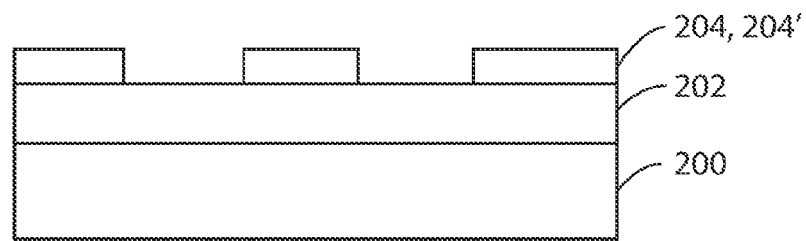
FIGS. 2A-2C illustrate a method of forming word lines according to an embodiment of the present invention.
Figure 2B:
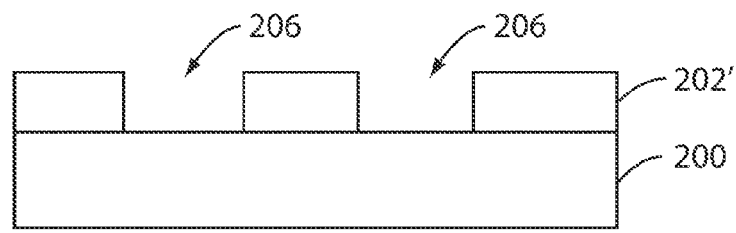
Figure 2C:
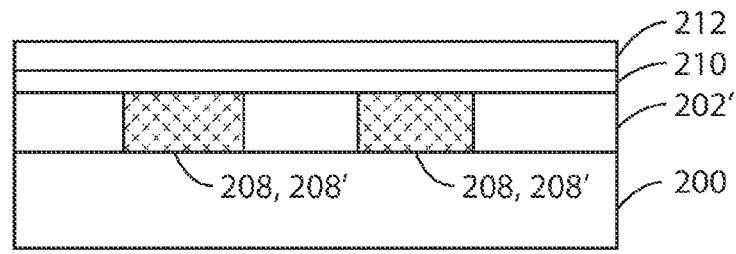

FIGS. 2A-2C illustrates a method of forming word lines according to an embodiment of the present invention. A first semiconductor substrate 200 is provided (see FIG. 2A). The substrate 200 is a silicon substrate in an embodiment but may be other types, e.g., silicon germanium substrate. An insulation layer 202, e.g., oxide layer, is formed over the substrate 200. The oxide layer 202 may be formed by using a chemical vapor deposition or other suitable processes. A photoresist layer 204 is formed over the oxide layer 202 to substantially uniform thickness by spin coating. The photoresist layer 204 is patterned by exposing the photoresist layer to a pattern of light. The resulting photoresist mask 204' is used to etch portions of the oxide layer exposed by the photoresist mask. If positive photoresist is used, portions of the photoresist layer exposed to the light become soluble in a developer solution and are removed. If negative photoresist is used, the non-exposed portions become soluble and are removed.

The oxide layer 202 is etched using the photoresist mask 204' (FIG. 2B). The resulting oxide layer 202' defines a plurality of recesses 206 wherein word lines are to be formed. In an embodiment, the recesses 206 have line patterns extending substantially from one end of a cell region to the end of the cell region, corresponding to the shape of the word lines to be formed therein.

A conductive material 208 is deposited over the oxide layer 202' and into the recesses 206 (FIG. 2c). In an embodiment, the conductive material 208 consists essentially of metal having relatively low resistivity in order to keep the word line resistance low. The word lines extend substantially from one end of the cell region to the other end. The word lines define the rows in a memory cell array and are used to apply control signals to the gates of the memory cells in their corresponding rows (see numeral 110 in FIG. 1B). When the word line resistance is too high, much of the applied voltage is consumed by the word line and dissipated in a form of heat. Accordingly a higher voltage would be needed to operate the devices with a higher word line resistance than those with a lower word line resistance. Higher voltages would mean greater power consumption and more heat generation, which would hinder scaling down of the devices to very small sizes. Keeping the word line resistance low, therefore, is important in manufacturing highly dense semiconductor devices.

In an embodiment, the conductive material 208 is tungsten and is deposited over the oxide layer 202' using a chemical vapor deposition. Tungsten is commonly used metal material in the semiconductor processes since tungsten CVD provides excellent gap-filling characteristics. In other embodiments, aluminum, copper, or other metal having relatively low resistance may be used as the conductive material 208. In yet other embodiments, the conductive material includes polysilicon or non-metal substance.

The conductive material 208 is planarized to define a plurality of word lines 208' within the recesses 206. In an embodiment, a chemical mechanical planarization (CMP) process is used to form the word lines 208'. CMP is a process of smoothing surfaces with a combination of chemical and mechanical forces. A nitride layer 210 is formed over the word lines 208'. An oxide layer 212 is formed over the nitride layer 210. These layers 210 and 212 are formed over the word lines 208' and used as passivation layers to prevent oxidation of the word lines 208' in the present embodiment. According to implementation, materials other than oxide or nitride may be used as passivation layers (or as barrier layers). For example, tantalum nitride may be used as a barrier layer around the word lines 208' if copper is used as the conductive material.

Figure 2D:
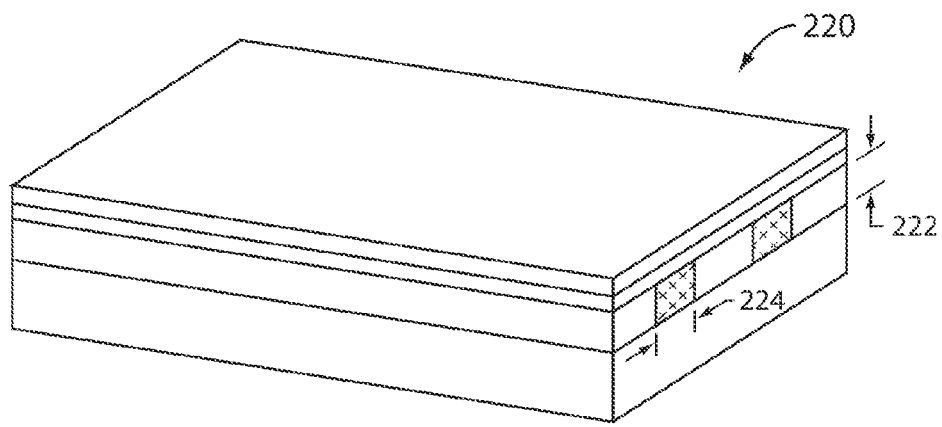
FIG. 2D illustrates a perspective view of a resulting substrate after the word lines have been formed on the first substrate using the process associated with FIGS. 2A-2C.

FIG. 2D illustrates a perspective view of a resulting substrate 220 after the word lines have been formed on the first substrate using the process described above in connection with FIGS. 2A-2C. In an embodiment, the word lines 208' are subsequently converted into buried word lines, as will be described more fully below. In an embodiment, the buried word lines have a vertical dimension 222 that is greater than their lateral dimension 224 since the vertical dimension 222 would be less affected by the pillar density than the lateral dimension 224.

Figure 3A:
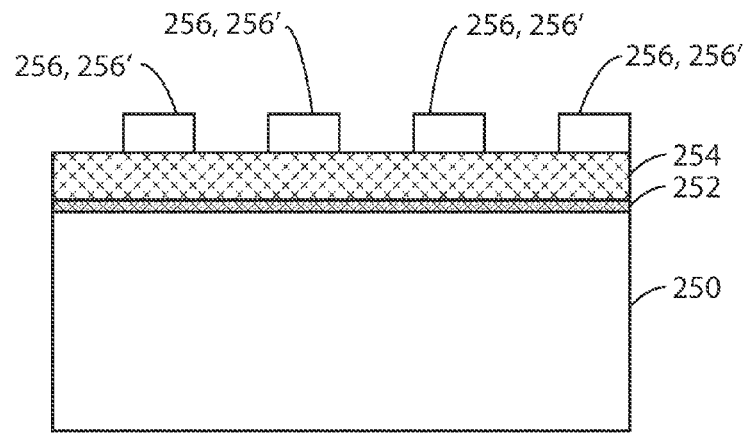
FIGS. 3A and 3B illustrate a method of forming bit lines according to an embodiment of the present invention.
Figure 3B:
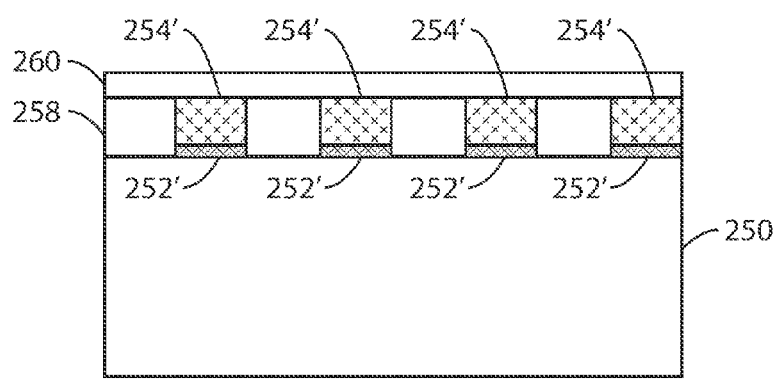

FIGS. 3A and 3B illustrate a method for forming bit lines according to an embodiment of the present invention. A second semiconductor substrate 250 is provided (see FIG. 3A). The substrate 250 is a silicon substrate in an embodiment but may be other types, e.g., silicon germanium substrate. A thin layer of doped polysilicon 252 is formed over the substrate 250. The doped polysilicon layer 252 is subsequently used to form bit line junctions.

A conductive material 254 is deposited over the doped polysilicon layer 252. The conductive material 254 preferably is made of material having relatively low resistivity since it is used subsequently to form bit lines. In an embodiment, the conductive material 254 includes tungsten. In other embodiments, aluminum, copper, or other metal having relatively low resistance may be used as the material for the conductive material 254. In yet other embodiments, polysilicon or non-metal substance may be used as or included in the conductive material 254.

A photoresist layer 256 is formed over the conductive material 254 to substantially uniform thickness by spin coating. The photoresist layer 256 is patterned by exposing the photoresist layer to a pattern of light, thereby obtaining a photoresist mask 256'.

Referring to FIG. 3B, the photoresist mask 256' is used to etch portions of the conductive layer 254 and the doped polysilicon layer 252 to form a plurality of bit lines 254' and a plurality of bit lines junctions 252'. In an embodiment, the bit lines 254' and the bit line junctions 252' are line patterns extending substantially from a top end of a cell region to a bottom end of the cell region. Accordingly, as with the word lines, keeping the bit line resistance low is important in a highly dense semiconductor device. The bit lines define the columns in a memory cell array in certain memory devices, e.g., DRAM. As will be understood by those skilled in the art, the terms "top," "bottom," "left," and "right" with respect to the cell region may be used interchangeably according to the orientation being used.

An oxide layer 258 is formed over the bit lines 254' and fills the spaces defined by the adjacent bit lines. A CMP process is formed to remove the excess oxide layer 258 and have the top surface of the oxide layer 258 to be flushed to the top surface of and the bit lines 254'. In an embodiment, the bit lines 254' may be formed using a damascene process, where the bit line material is deposited within a recess defined by the oxide layer and then removing the excess bit line material.

Another oxide layer 260 is formed over the bit lines 254' and the oxide layer 258. In the present embodiment, the oxide layer 260 is used to facilitate the bonding of the second substrate to the first substrate to form the buried bit lines and the buried word lines. In another embodiment, the oxide layer 260 may not be formed if it is not needed to bond the substrates together.

Figure 3C:
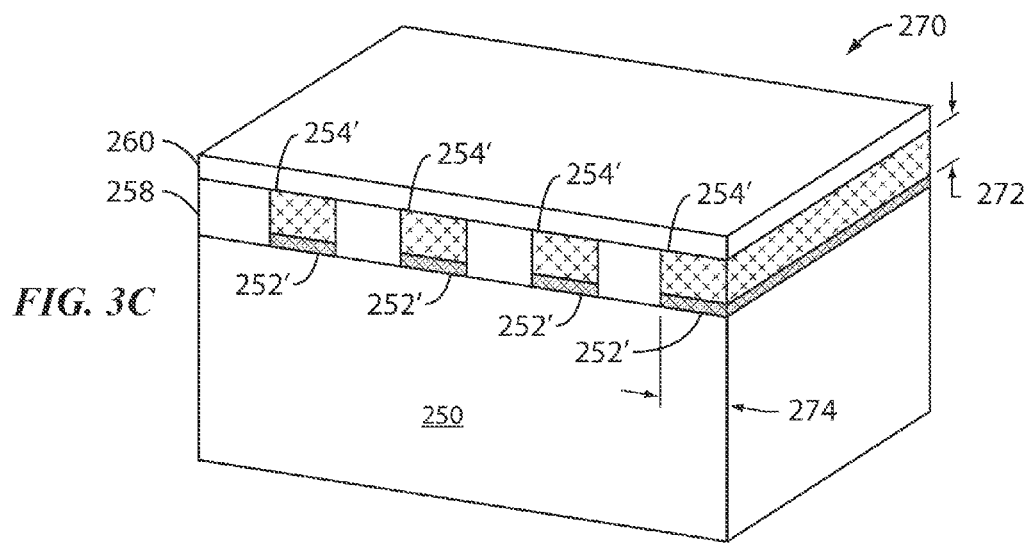
FIG. 3C illustrates a perspective view of a resulting substrate after the bit lines have been formed on the second substrate using the process associate with FIGS. 3A-3B.

FIG. 3C illustrates a perspective view of a resulting substrate 270 after the bit lines have been formed on the second substrate using the process described above in connection with FIGS. 3A-3B. In an embodiment, the bit lines 254' are subsequently converted into buried bit lines, as will be described below. In an embodiment, the buried bit lines have a vertical dimension 272 that is greater than their lateral dimension 274 since the vertical dimension 272 would be less affected by the pillar density than the lateral dimension 274.

FIGS. 4A-4L illustrates a method for forming a semiconductor device having vertical gate transistors, buried bit lines and buried word lines according to embodiments of the present invention. The figures show cross-sectional views of a portion of a substrate cut along a lateral direction, i.e., the direction along which the word lines extend in a cell region.

In an embodiment, the buried bit lines and the buried word lines in FIGS. 4A-4L are formed by bonding two separate substrates, such as those (substrates 250 and 270) shown in FIGS. 2D and 3C. Those skilled in the art will appreciate that there are other methods of forming the buried bit lines and the buried word lines in FIGS. 4A-4L, e.g., by using conventional fabrication steps that does not use a bonding technique.

FIG. 4A illustrates a substrate 400 having a first substrate 402 and a second substrate 403 that are bonded to each other according to an embodiment of the present invention. The first substrate 402 corresponds to the substrate 220 in FIG. 2D, and the second substrates 403 corresponds to the substrate 270 in FIG. 3C. The first and second substrate 402 and 403 are bonded so that the buried bit lines and the buried word lines overlap each other to form rows and columns in a memory cell array.

The first substrate 402 includes a lower layer 404, a buried oxide layer 405 overlying the lower layer 404, and a buried word line 406 overlying the buried oxide layer 404. The lower layer 404 is silicon material and corresponds to a substrate 200 in FIG. 2A in an embodiment. Although FIG. 4A shows only one buried word line, the first substrate 402 includes a plurality of buried word lines that extend in parallel to the buried word line 406. In an embodiment, the buried word line 406 extends substantially from one end of the cell region to the other end. The buried word line 406 defines a row in a memory cell array and is configured to provide control signals to the gates of all the memory cells in that row.

In the present embodiment, the buried word line 406 is "buried" or formed apart from the gates of the memory cells unlike in the conventional devices. Accordingly, the buried word line 406 can be provided with sufficient thickness to keep the word line resistance low even as the cell sizes are reduced and the pillars are brought closer together. In addition, the gates on the pillars can be kept relatively thin to avoid a bridge formation between adjacent pillars.

In an embodiment, the buried word line 406 includes pure metal, e.g., tungsten, aluminum, or copper, since metal has lower resistance than polysilicon or other non-metals. In an embodiment, the buried word line 406 consists essentially of pure metal, e.g., tungsten, aluminum, or copper, or the like. In another embodiment, the buried word line 406 includes polysilicon, metal alloy, or other conductive materials. The word line resistance can be managed by providing the buried word line 406 with sufficient thickness laterally or vertically, or both, since it is formed apart from the gates. In an embodiment, the buried word line 406 has a vertical dimension that is greater than its lateral dimension since the vertical dimension would be less affected by the pillar density than the lateral dimension. In an embodiment, the ratio of the vertical dimension to the lateral dimension is 1, 1.5, 2, 2.5, 3, 3.5, or 4 or higher.

A nitride layer 408 is provided over the buried word line 406 to protect the buried word line 406 from being oxidized or otherwise separate the buried word line 406 from the adjacent materials. A bonding layer 410 (e.g., oxide) having suitable material for bonding is provided over the nitride layer 408. The boding layer 410 is used to bond two substrates 402 and 403 in the present embodiment.

The second substrate 403 includes a bonding layer 412 (e.g., oxide) contacting the bonding layer 410 of the first substrate. These two layers are brought together and bonded to each other using a well-known bonding process. The bonding processes include direct bonding, plasma activated bonding, anodic bonding, reactive bonding, thermocompression bonding, and others. The materials used for the layers 410 and 412 may vary depending on the bonding process used. In certain bonding processes, only one bonding layer may be used instead of two.

A plurality of buried bit lines 414 are provided over the bonding layer 412 and defined within an insulation material 418 (e.g., oxide). In the present embodiment, the buried bit lines 414 are "buried" or formed below the pillars whereon the transistors are to be formed subsequently. As with the buried word line 406, the buried bit lines 414 can be provided with sufficient thickness to keep the bit line resistance low even as the cell sizes are reduced and the pillars are brought closer together.

In an embodiment, the buried bit lines 414 include pure metal, e.g., tungsten, aluminum, or copper, since metal has lower resistance than polysilicon or other non-metals. In an embodiment, the buried bit lines 414 consist essentially of pure metal, e.g., tungsten, aluminum, copper, or the like. In another embodiment, the buried bit lines 414 include polysilicon, metal alloy, or other conductive materials. The bit line resistance can be managed by providing the buried bit lines 414 with sufficient thickness laterally or vertically, or both, since it is formed below the pillars. In an embodiment, the buried bit lines 414 have a vertical dimension that is greater than its lateral dimension since the vertical dimension would be less affected by the pillar density than the lateral dimension. In an embodiment, the ratio of the vertical dimension to the lateral dimension is 1, 1.5, 2, 2.5, 3, 3.5, or 4 or higher.

A plurality of conductive portion (or conductive layers) 416 are provided, respectively, on the buried bit lines 414. The conductive portions 416 are liner polysilicon for the buried bit lines 414 to reduce leakage current in the present embodiment. A semiconductor material 420 is provided over the buried bit lines 414 and the conductive portions 416 on the primary side of the substrate 400. The semiconductor material 420 is used to form pillars for vertical gate transistors. The material 420 is silicon in the present embodiment, but may be silicon germanium or other material according to implementation. A hard mask 422 is deposited over the material 420 for use in a subsequent pillar patterning process.

FIG. 4B illustrates a method of forming pillar structures according to an embodiment of the present invention. The hard mask 422 is patterned using a photoresist mask (not shown). The material 420 is etched using a hard mask pattern 422' to form a plurality of pillars 424 on the primary side the substrate 400. The memory cells are formed on this primary side as explained below. In an embodiment, the pillars 424 have a vertical dimension (or pillar height) 424a of 100 nm to 200 nm and a lateral dimension (or pillar width) 424b of 10 nm to 50 nm. The pillar height, in part, may vary according to the junction depth. The pillars 424 are spaced apart from the adjacent pillars by a distance 425 of 10 nm to 50 nm. In an embodiment, the lateral dimension 424b and the distance 425 are substantially the same, and define the feature size (F) of the device.

A gate dielectric layer 426 is formed conformally over the pillars 424. In an embodiment, the gate dielectric layer 426 includes silicon oxide ($SiO_2$), hafnium silicate (HfSiO), or other suitable dielectric material according to implementation. In an embodiment, the gate dielectric layer 426 is 1 nm to 6 nm thick.

Referring to FIG. 4C, a gate material 428 is formed conformally over the gate dielectric layer 426 and on the insulation layer 418. Since the distance between adjacent pillars are extremely small, the gate material 428 should be conductive material whose deposition can be controlled to obtain excellent thin, conformal coating over the gate dielectric layer 426. In an embodiment, the gate material is titanium nitride but may be other conductive material according to implementation. Titanium nitride may be deposited on the gate dielectric layer 426 using physical vapor deposition or chemical vapor deposition. In an embodiment, the gate material has thickness of no more than 10 nm. In an embodiment, the gate material has thickness of no more than 5 nm, or no more than 3 nm.

Bottom portions of the gate material 428 that are provided on the insulation layer 418 are etched to separate the gate material 428 in different columns (or buried bit lines) from each other. In an embodiment, an anisotropic etch, e.g., reactive ion etching, is used to remove these bottom portions of the gate material 428. At this time, the gate material 428 that is provided on top of the hard mask pattern 422' is also removed. Accordingly, the gate material 428 only remains on the sidewalls of the pillars 424 and the hard mask pattern 422'. As used herein, the term "on" does not require physical contact between materials unless the context of its usage requires it.

Figure 5A:
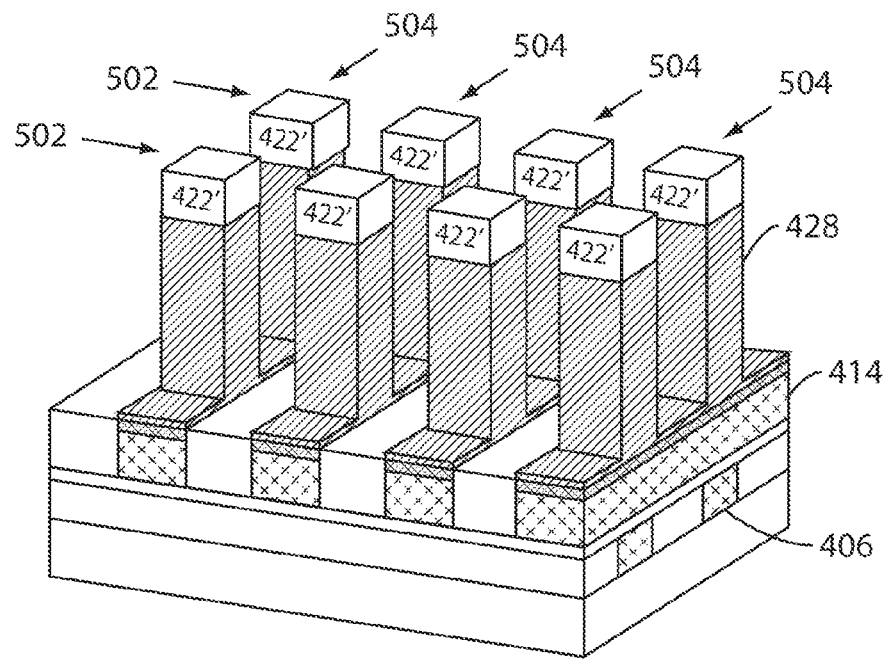
FIG. 5A illustrates a perspective view of the pillars with the gate material that has been etched according to an embodiment of the present invention.

FIG. 5A illustrates a perspective view of the pillars with the gate material 428 that has been etched according to an embodiment of the present invention. The pillars are arranged in rows 502 and columns 504. A bottom portion of the gate material has been removed to electrically separate the pillar columns 504 from each other so that the buried bit lines can be used to control these pillar columns 504 separately (see FIG. 4C). The pillar rows 502 and the pillar columns 504 define the columns and rows, respectively, in a memory cell array.

Referring back to FIG. 4C, a first spin-on-dielectric (SOD) 430 is deposited over the pillars 424 and within the spaces defined by the pillars 424. SOD is flowable, inorganic polymer that is used as insulation material. SOD is used as gap-fill material in part due to its a low-k dielectric constant, which minimizes charge build up and crosstalk that adversely affect the performance of the device.

SOD is annealed to harden it. In an embodiment, a rapid thermal processing (or RTP) is used to anneal the SOD. RTP involves heating a substrate to high temperatures (up to 1,200° C. or greater) on a timescale of several seconds or less and then cooling the substrate slowly. Once the first SOD 430 has been hardened, an excess amount of the first SOD 430 is removed using a chemical mechanical planarization process, making the top surface of the first SOD 430 to be flushed with the top surface of the hard mask pattern 422. In an embodiment, nitride or other suitable material may be formed over the gate material 428 as a barrier or passivation layer prior to the SOD deposition step.

The first SOD 430 is etched back to expose an upper portion 432 of the gate material 428 (FIG. 4D). In an embodiment, a wet etching is performed for a given amount of time to remove a desired amount of the SOD. The wet etching uses liquid-phase ("wet") etchants by immersing a substrate in a bath of etchant.

Referring to FIG. 4E, the exposed upper portion 432 of the gate material 428 is etched. The remaining lower portion 433 of the gate material 428 defines the gates of the transistors formed using the pillars 424. Hereinafter, the remaining portion 433 of the gate material may also be referred to as a gate or gates 433. In an embodiment, the gate material 428 is titanium nitride (TiN) and the gate dielectric layer 426 is silicon oxide ($SiO_2$). The titanium nitride is etched using a dry etch process having a high etch selectivity of TiN to $SiO_2$. The type of etchant used (e.g., $Cl_2$ and $N_2$), the flow rate, bias power, and reaction pressure, and other etch parameters can be adjusted to control the etch selectivity. In an embodiment, the bias power is adjusted (e.g., reduced to 30 W or less, or 20 W or less, or 15 W or less) in order to increase the etch selectivity of TiN to $SiO_2$. High etch selectivity is important since the upper portion 432 of the TiN layer should be removed without etching or damaging the underlying gate oxide 426, particularly since the gate dielectric layer 426 tends to be extremely thin, e.g., 30 angstroms or less.

Referring to FIG. 4F, a second SOD 434 is deposited to gap-fill the spaces defined by the etching of the first SOD 430 and the upper portion 432 of the gate material 428. The second SOD 434 is annealed to harden it. An excess amount of the second SOD 434 is removed to make the top surfaces of the second SOD 434 and the hard mask pattern 422' to be flushed with each other, e.g., by using CMP. In an embodiment, a protective layer (not shown), e.g., nitride, may be formed over the gate dielectric layer 428 prior to the deposition of the second SOD 434. The protective layer may be used to protect the gate dielectric layer and the pillar during a subsequent interposer etch step.

Referring to FIG. 4G, an interposer mask (not shown) is formed over the second SOD 434 defining locations where interposers are to be formed. The interposers are gate connectors that connect the gates to the buried word lines 406 so that the buried word lines 406 that are formed apart from the gates can send control signals to the gates. In an embodiment, as with the buried word line 406, the interposer mask is a line pattern that extends along laterally and crosses the buried bit lines 414. In an embodiment, the interposer mask and the buried word lines are orthogonal with respect to the buried bit lines 414. The exposed portions of SOD 430, 434 are etched to define openings 436 wherein interposers will be formed subsequently. The nitride layer 408 is used as an etch stop. Grooves 438 may be created on the nitride layer 408 since it is difficult to stop the SOD etch perfectly at the nitride layer.

An insulation layer 438 is formed conformally over a plurality of pillar structures 439 (FIG. 4H). The pillar structures 439 comprise the pillars 424, the gate dielectric layer 426, the gates 433, and the hard mask pattern 422'. In an embodiment, the insulation layer 438 is nitride. The nitride layer 438 provided over the gates 433 prevents an electric short between the gates 433 and the buried bit lines 414 when the conductive material for the interposer is deposited into the openings 436 that have been defined by the SOD etching in a previous step. In an embodiment, the nitride layer 438 is formed using a chemical vapor deposition such as plasma enhanced chemical vapor deposition (PECVD) or a low-pressure chemical-vapor-deposition (LPCVD) that provide good film uniformity.

In an embodiment, a lower portion of the nitride layer 438 provided on the buried word line 406 is etched so that the nitride layer 438 remains only on the sidewalls of the pillar structures 439. As used herein, the term "pillar structure" refers to any structure that has a pillar-like shape. Accordingly, the nitride layer 438 remaining on the sidewalls of the pillar structures 439 comprises part of new pillar structures.

Exposed portions 440 of the buried word line 406 may have small grooves since it may be difficult to perfectly control the etch process to stop at the top surface of the buried word line 406. In an embodiment, an anisotropic etching, e.g., reactive ion etching, is used to remove the lower portion of the nitride layer 438.

A first conductive material 442 for in an interposer is deposited and provided into the openings 436 (FIG. 4I). In an embodiment, the first conductive material 442 is tungsten since it has excellent characteristics for filling holes and vias. In an embodiment, tungsten is deposited using tungsten hexafluoride $WF_6$ in a CVD process.

Tungsten 442 is etched back to adjust its height so that an upper portion of the gates 433 can be exposed in a subsequent process. In an embodiment, the etch process used is a reactive ion etching process with fluorinated gas plasmas, e.g., $SF_6$, $CF_4$, $CBrF_3$, and CHF3, mixed with oxygen. A portion 442' of tungsten that remains after the etch serves as an etch mask during subsequent steps. The portion 442' may also be referred to as a "lower interposer" since it will be used in conjunction with another conductive material to connect the gates 433 to the buried word line 406.

In an embodiment, the etch step for adjusting the height of the first conductive material 442 can be skipped if its deposition process can be controlled with sufficient precision to stop at the desired height. In an embodiment, the first conductive material 442 includes metal other than tungsten (e.g., aluminum) or non-metal (e.g., doped polysilicon).

Figure 5B:
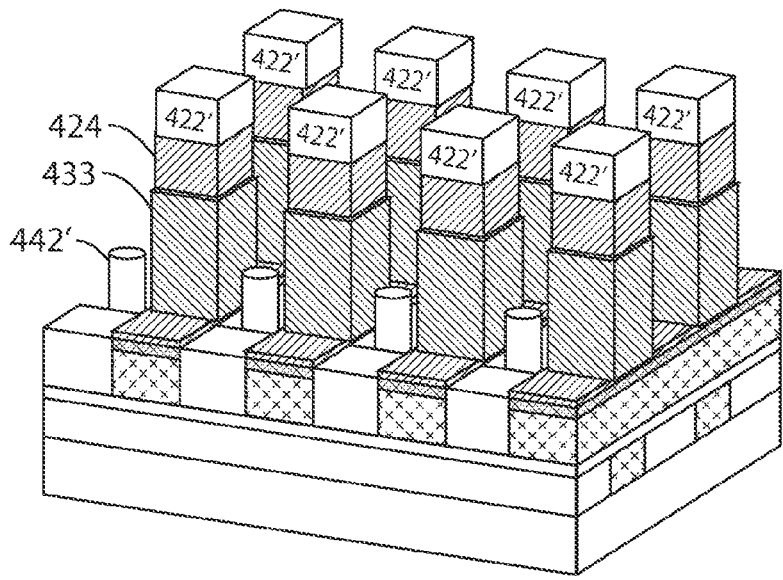
FIG. 5B illustrates a perspective view the pillar structures with the gates and the first conductive material after the etchback step according to an embodiment of the present invention.

FIG. 5B illustrates a perspective view the pillar structures with the gates 433 and the first conductive material 442' after the etchback step according to an embodiment of the present invention. The nitride layer 438 is not shown to better illustrate the first conductive material 442'. The first conductive material 442' is also referred to as a lower interposer or the lower gate connector. The gates 433 surround lower portions of the corresponding pillars 424. The pillars 424 and the gates 433, therefore, define vertical surrounding gate transistors (VSGT) in the present embodiment. In other embodiments, the gates 433 may be placed on only one side of the pillar 424, or on only two side sides of the pillars, or on two or more sides without completely surrounding the pillars 424.

Referring to FIG. 4J, a portion of the nitride layer 438 on the pillar structures that is not covered by the tungsten 442' is etched. The etch process used should be carefully selected not to damage the underlying layers, i.e., the gate dielectric layer and the gate material, provided on the pillars 424 since damages to these underlying layers would compromise the integrity of the device. Accordingly, an etch step should be selected by taking account the materials used for the gate dielectric layer 426, the gate material 428, and the insulation layer 438 as well as the first conductive material 442'. In an embodiment, the gate dielectric 426, the gate material 428, the insulation layer 438, and the first conductive material 442 are silicon oxide, titanium nitride, silicon nitride, and tungsten, respectively, and the etch process used is a cleaning process using phosphoric acid ($H_3PO_4$). Phosphoric acid can be used to etch the nitride layer 438 without attacking the gate oxide layer 426 and the TiN gates 428. With a portion of the nitride layer 438 removed, an upper portion 444 of the gate material 428 (or gates 433) is exposed.

Referring to FIG. 4K, a second conductive material 446 is deposited over the first conductive material 442' and contacts the upper portion 444 of the gate material. In an embodiment, the second conductive material 446 is tungsten and is the same material as the first conductive material 442'. Accordingly, the boundary between these two is not shown in the figure. In another embodiment, different materials can be used for the first and the second conductive materials 442' and 446. In an embodiment, the second conductive material 446 includes aluminum, polysilicon, or other suitable conductive materials.

An excess amount of the second conductive material 446 is removed using a CMP or an etchback process. A resulting conductive material 446' is also referred to as an upper interposer or an upper gate connector. The second interposer 446' cooperates with the lower interposer 442' to electrically couple the gates 428 and the buried word line 406. In an embodiment, a bottom of the second interposer (or upper interposer) 446' contacts a top of the lower interposer 442', and a side of the second interposer 446' contacts the upper portion 444 of the gate material. The lower and second interposers 442' and 446' may or may not be of the same conductive material according to implementation. For convenience, the lower and second interposers may be collectively or individually referred to as an "interposer" or "gate connector."

Figure 5C:
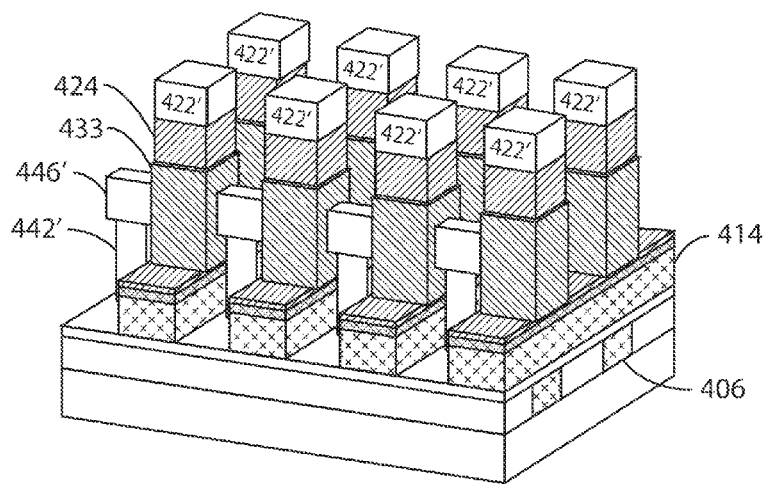
FIG. 5C illustrates a perspective view of the pillar structures with the gates, the first interposer, and the upper interposer after the CMP/etchback step according to an embodiment of the present invention.

FIG. 5C illustrates a perspective view of the pillar structures with the gates 433, the lower interposer 442', and the upper interposer 446' after the CMP/etchback step according to an embodiment of the present invention. The nitride layer 438 is not shown to better illustrate the lower interposer 442' and the upper interposer 446'.

Referring to FIG. 4L, a nitride layer 450 is formed conformally over the upper portion 444 of the gate material, the gate dielectric 426, and second interposer 446'. The nitride layer 450 prevents oxidation or otherwise protects the gate material and the second interposer 446'. Since the nitride layer 450 is relatively thin, a plurality of holes is left unfilled between the pillar structures. A third SOD 452 is deposited to fill these holes. The third SOD 452 is hardened and excess amount is removed by CMP. A resulting top surface 454 is substantially planar to prepare the substrate 400 for subsequent fabrication processes. In an embodiment, a plurality of capacitors is formed over the top surface 454 to store charge information for memory cells. Other semiconductor components may be formed on or over the top surface 454 according to implementation.

Figure 5D:
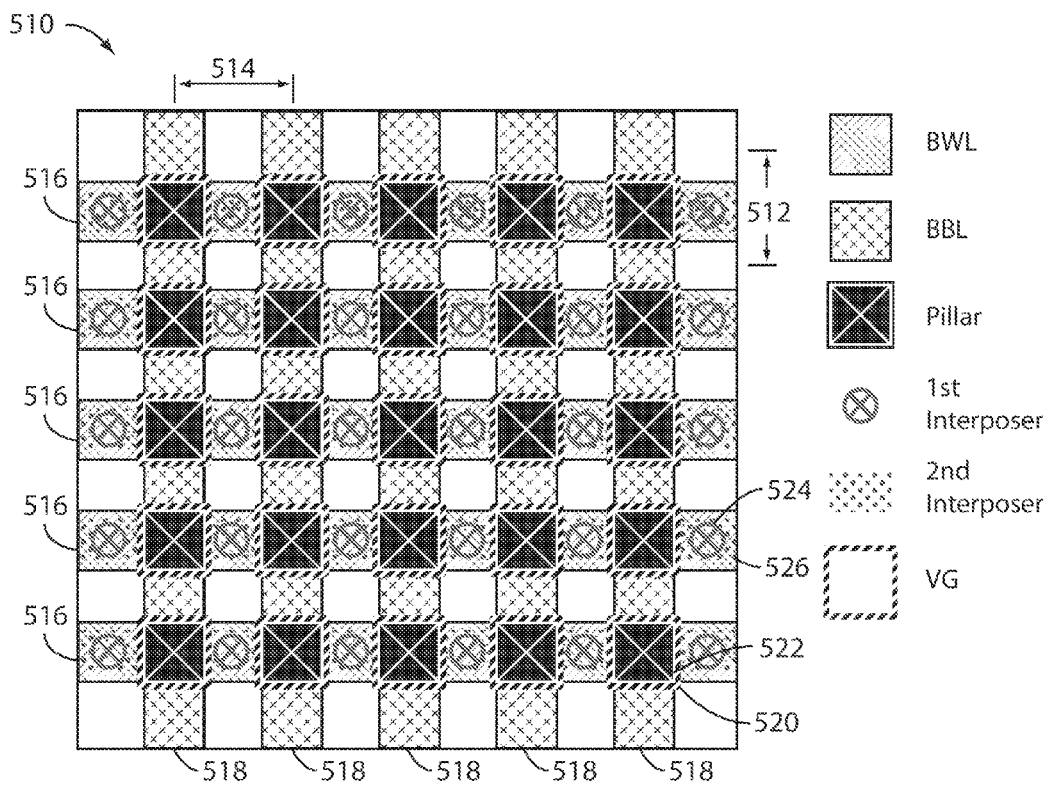
FIG. 5D illustrates a top plan view of a portion of cell region after the upper interposer is formed according to an embodiment of the present invention.

FIG. 5D illustrates a top plan view of a portion of cell region 510 after the second interposer 446' is formed according to an embodiment of the present invention. The cell region 510 illustrates a 4F2 configuration, where the width 512 and length 518 of a cell are each twice the feature size "F", and thus 2F×2F or $4F^2$. A plurality of buried word lines 516 extends along one direction (e.g., first direction). A plurality of buried bit lines 518 extends along another direction (e.g., second direction) that is orthogonal to the direction of the buried word lines 516. A plurality of vertical gates 520 are formed on a plurality of pillars 522. A plurality of first interposers (or lower interposers) 524 is formed over the buried word lines 516 and provides electrical connection to the buried word lines 518. A plurality of second interposers (or upper interposers) 526 is provided over the first interposer 524 and provides electrical connection to the vertical gates 520. Accordingly, the first interposers 524 and the second interposers 526 together provide electrical coupling between the vertical gates 520 and the buried word lines 516. In an embodiment, each pair of the first and second interposers 524 and 526 are coupled to two adjacent vertical gates 520.

An embodiment of the present invention is directed to a DRAM device. In such an embodiment, the capacitors (formed above the surface 454 of FIG. 4L), the pillar structures, the buried bit lines and the buried word lines define a memory cell array for a memory device. In an embodiment, a plurality of memory cell arrays are stacked in a vertical direction in order to squeeze in even more memory cells in a given area of a substrate.

Embodiments of the present invention provide buried word lines apart from the gates of the transistors. Since the buried word lines are located below the pillars, the parasitic capacitance between a word line and adjacent conductive components (e.g., capacitors provided above the pillar structures) can be reduced compared with a vertical gate device that has the word line formed on a middle of the pillar as a gate-contact line. Also an accidental bridge between a storage node contact and the word line can be prevented. In addition, since the buried bit lines are formed before the pillar structures are formed, the pillar leaning phenomenon during formation of the buried bit line process can be minimized. Those skilled in the art will appreciate that the invention described herein provides other benefits and advantages.

The present invention has been described in terms of specific embodiments. Various alternatives and equivalents are possible. The embodiments described herein should not be used to limit the scope of the invention. For example, although the invention has been described in the context of a DRAM device, the invention is not limited to a DRAM device. The vertical gate transistor device of the present invention may be used in other types of memory devices as well as non-memory devices (e.g., ASICs, CPUs, GPUs). Also the buried bit lines and the buried word lines may be formed on a single substrate in a sequence of steps without bonding two substrates. Other additions, subtractions, or modifications would be obvious to those skilled in the art in view of the present disclosure. The scope of the invention should be interpreted using the appended claims.

What is claimed is:

1. A semiconductor device, comprising:
   a substrate having a primary side;
   a first pillar extending vertically with respect to the primary side of the substrate, the first pillar defining a channel region;
   a first gate provided over the channel region of the first pillar;
   a buried word line extending along a first direction below the first pillar, the buried word line configured to provide a first control signal to the first gate; and
   a first interposer coupling the buried word line and the first gate to enable the first control signal to be applied to the first gate via the buried word line.

2. The device of claim 1, wherein the first interposer and the first gate have different conductivities.

3. The device of claim 1, wherein the first interposer includes a first portion that is in contact with the buried word line and a second portion that is contact with the first gate, the first and second portions being coupled to each other in order to provide a signal path between the buried word line and the first gate for the first control signal.

4. The device of claim 1, further comprising:
   a second pillar extending vertically with respect to the primary side of the substrate, the second pillar defining a channel region;
   a second gate provided over the channel region of the second pillar; and
   a second interposer coupling the buried word line and the second gate to enable a second control signal to be applied to the second gate via the buried word line.

5. The device of claim 3, wherein the first and second portions of the first interposer are formed using different processing steps.

6. The device of claim 5, wherein the first portion of the first interposer and the second portion of the interposer have different conductivities.

7. The device of claim 5, wherein the first portion of the first interposer and the second portion of the first interposer have substantially the same conductivity.

8. The device of claim 4, wherein the second portion of the first interposer is in contact with the first and the second gates of the first and the second pillars.

9. The device of claim 4, wherein the first gate surrounds the first pillar at the channel region of the first pillar.

10. The device of claim 4, wherein the first gate is provided over at least first and second sides of the first pillar.

11. The device of claim 4, wherein the first and second gates each includes a first conductive material and the first interposer includes a second conductive material different from the first conductive material.

12. The device of claim 4, further comprising:
    a buried bit line extending along a second direction below the first pillar, the buried bit line coupled to the first pillar, the second direction being different than the first direction so that the buried word line and the buried bit line extend along different directions and define an overlapping region.

13. The device of claim 4, wherein the buried word line has a vertical dimension and a lateral dimension, the vertical dimension being greater than the lateral dimension.

14. The device of claim 4, further comprising:
    a third pillar extending vertically with respect to the primary side of the substrate, the third pillar defining a channel region; and
    a third gate provided over the channel region of the third pillar,
    wherein the first interposer is provided within a first space defined between the first and second pillars, and the second interposer is provided within a second space defined between the second and third pillars.

15. The device of claim 11, wherein the first conductive material is titanium nitride and the second conductive material is tungsten.

16. The device of claim 13, wherein a ratio of vertical dimension to the lateral dimension of the buried word lines is 1.5 or greater.

17. The device of claim 13, wherein the first interposer is provided within a space defined between the first and second pillars; and
    wherein the first and second gates each includes titanium nitride and the first and second interposer each includes tungsten.

18. The device of claim 13, further comprising:
    a second buried bit line extending along the second direction below the second pillar, the second buried bit line coupled to the second pillar, the second direction being different than the first direction so that the buried word line and the second buried bit line extend along different directions and define a second overlapping region,
    wherein the first and second buried bit lines define a space therebetween and the first interposer couples with the buried word line provided below the first and second bit lines through the space defined by the first and second buried bit lines.

19. The device of claim 18, wherein the first interposer extends through the space defined between the first and second buried bit lines to contact the buried word line.

20. The device of claim 14, wherein the device defines cells having 4F2 dimensions.

21. The device of claim 20, further comprising:
    a first buried bit line extending along a second direction below the first pillar, the first buried bit line coupled to the first pillar, the second direction being different than the first direction so that the buried word line and the first buried bit line extend along different directions and define a first overlapping region;
    a second buried bit line extending along the second direction below the second pillar, the second buried bit line coupled to the second pillar, the second direction being different than the first direction so that the buried word line and the second buried bit line extend along different directions and define a second overlapping region; and
    a third buried bit line extending along the second direction below the third pillar, the third buried bit line coupled to the third pillar, the second direction being different than the first direction so that the buried word line and the third buried bit line extend along different directions and define a third overlapping region;

wherein the first and second buried bit lines define a space therebetween and the first interposer couples with the buried word line provided below the first and second bit lines through the space defined by the first and second buried bit lines, and wherein the second and third buried bit lines define a space therebetween and the second interposer couples the buried word line provided below the second and third bit lines through the space defined by the second and third buried bit lines.

22. The device of claim 21, further comprising:
a doped polysilicon layer provided between the first, second, and third buried bit lines and the first, second, and third pillars.

23. The device of claim 21, wherein the device is a dynamic random access memory (DRAM) device.

24. The device of claim 21, wherein the buried word line is formed on a first substrate, and the first, second, and third bit lines are formed on a second substrate, and
wherein the first and second substrates are bonded to define the primary side of the substrate whereon the first, second, and third pillars are provided.

25. The semiconductor device of claim 24, wherein the first conductive lines are buried word lines and the second conductive lines are buried bit lines, and
wherein each buried word line has a vertical dimension and a lateral dimension, the vertical dimension being greater than the lateral dimension.

26. A semiconductor device, comprising:
a plurality of first conductive lines extending along a first direction, each first conductive line being substantially parallel to each other;
a plurality of second lines extending along a second direction and overlying the first conductive lines, each second conductive line being substantially parallel to each other;
a plurality of pillars, each pillar being provided over the first and second conductive lines, each pillar defining a channel region;
a plurality of gates, each gate provided over the channel region of the each pillar; and
a plurality of interposers, each interposer coupling one of the first conductive lines to one or more of the gates to enable a first control signal to be applied from said one first conductive line to said one or more gates.

27. The semiconductor device of claim 26, wherein the gates include a first conductive material and the interposers include a second conductive material that is different than the first conductive material.

28. The semiconductor device of claim 26, wherein each interposer is provided between a space defined by two adjacent pillars in the same row in a memory cell array.

29. The semiconductor device of claim 26, wherein the gates include titanium nitride and the interposers include tungsten.

30. The semiconductor device of claim 29, wherein a ratio of vertical dimension to the lateral dimension of the buried word lines is 1.5 or greater.

31. A semiconductor device, comprising:
a substrate having a primary side;
a first pillar extending vertically with respect to the primary side of the substrate, the first pillar defining a channel region;
a first gate provided over the channel region of the first pillar;
a second pillar extending vertically with respect to the primary side of the substrate, the second pillar defining a channel region;
a second gate provided over the channel region of the second pillar;
a first buried word line extending along a first direction below the first and second pillars, the first buried word line being configured to provide a first control signal to the first gate;
a first interposer coupling the first buried word line and the first gate to enable the first control signal to be applied to the first gate via the first buried word line;
a second buried word line extending along substantially in parallel to the first buried word line below the first and second pillars, the second buried word line being configured to provide a second control signal to the second gate; and
a second interposer coupling the second buried word line and the second gate to enable the second control signal to be applied to the second gate via the second buried word line.

* * * * *